(12) United States Patent
Lin et al.

(10) Patent No.: US 8,995,706 B2
(45) Date of Patent: Mar. 31, 2015

(54) METHOD FOR PROTECTING DIGITAL CONTENT AGAINST MINORITY COLLUSION ATTACKS

(75) Inventors: Wan-Yi Lin, College Park, MD (US); Shan He, Plainsboro, NJ (US); Jeffrey Adam Bloom, West Windsor, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 562 days.

(21) Appl. No.: 12/998,185

(22) PCT Filed: Sep. 26, 2008

(86) PCT No.: PCT/US2008/011209
§ 371 (c)(1),
(2), (4) Date: Mar. 25, 2011

(87) PCT Pub. No.: WO2010/036224
PCT Pub. Date: Apr. 1, 2010

(65) Prior Publication Data
US 2011/0182466 A1    Jul. 28, 2011

(51) Int. Cl.
*G06K 9/00* (2006.01)
*G06T 1/00* (2006.01)
(Continued)

(52) U.S. Cl.
CPC ......... *G06T 1/005* (2013.01); *G06T 2201/0063* (2013.01); *H03M 13/1515* (2013.01); *H03M 13/63* (2013.01); *H04N 1/32144* (2013.01);
(Continued)

(58) Field of Classification Search
CPC .......... G06T 1/005; G06T 2201/0063; H04N 1/32144; H04N 2201/3236; H04N 2201/3269; H04N 2201/3284; H03M 13/515; H03M 13/63
See application file for complete search history.

(56) References Cited

U.S. PATENT DOCUMENTS 6,256,355 B1    7/2001  Sakoda et al.
6,285,774 B1 *  9/2001  Schumann et al. ........... 382/100
(Continued)

FOREIGN PATENT DOCUMENTS

JP    11041114    2/1999
JP    11330985    11/1999
(Continued)

OTHER PUBLICATIONS

Roneid, Tor, "Collusion-Secure Fingerprinting a Simulation of the Boneh and Shaw Scheme Coding Theory and Cryptography", 2005, Universitas Bergensis.*

(Continued)

*Primary Examiner* — Katrina Fujita
(74) *Attorney, Agent, or Firm* — Robert D. Shedd; Ivonete Markman

(57) ABSTRACT

A method and system of detecting colluders conducting a collusion attack including a minority-type collusion attack on a digital product includes the generation of codewords used as watermarks in the digital product. The inner code of the codewords is generated using permutations of rows in a Hadamard matrix and concatenating them together. A typical outer code of the codeword is the Reed Solomon code. An adaptive detector is able to accurately detect one of three or more colluders of a minority-type attack. Prior art schemes using an error correcting code-based watermarking mechanism with an inner code fail to detect colluders with a minority-type collusion attack which includes three colluders.

30 Claims, 10 Drawing Sheets

(51) Int. Cl.
*H03M 13/00* (2006.01)
*H04N 1/32* (2006.01)
*H03M 13/15* (2006.01)

(52) U.S. Cl.
CPC *H04N 2201/3236* (2013.01); *H04N 2201/3269* (2013.01); *H04N 2201/3284* (2013.01)
USPC .......................................................... 382/100

(56) References Cited

U.S. PATENT DOCUMENTS

| | | | |
|---|---|---|---|
| 6,466,142 B1 | 10/2002 | Barbano | |
| 6,898,334 B2 | 5/2005 | Sayers | |
| 7,408,991 B2 | 8/2008 | Hourunranta | |
| 7,624,273 B2* | 11/2009 | Muratani | 713/176 |
| 7,702,127 B2* | 4/2010 | Mihcak et al. | 382/100 |
| 7,739,511 B2* | 6/2010 | Horne et al. | 713/176 |
| 7,814,564 B2* | 10/2010 | He et al. | 726/32 |
| 8,032,754 B2* | 10/2011 | Mihcak et al. | 713/176 |
| 8,208,683 B2 | 6/2012 | Yamamoto et al. | |
| 2005/0086487 A1 | 4/2005 | Yacobi et al. | |
| 2006/0008157 A1 | 1/2006 | Hagita | |
| 2006/0045214 A1 | 3/2006 | Shiina | |
| 2007/0253592 A1* | 11/2007 | Sun et al. | 382/100 |
| 2008/0069396 A1* | 3/2008 | He et al. | 382/100 |

FOREIGN PATENT DOCUMENTS

| | | |
|---|---|---|
| JP | 2000174628 | 6/2000 |
| JP | 2000174631 | 6/2000 |
| JP | 2000339852 | 12/2000 |
| JP | 2000358154 | 12/2000 |
| JP | 2003249859 | 9/2003 |
| JP | 2003263605 | 9/2003 |
| JP | 2004241938 | 8/2004 |
| JP | 2004282674 | 10/2004 |
| JP | 2005210194 | 8/2005 |
| JP | 2005237033 | 9/2005 |
| JP | 2006025060 | 1/2006 |
| JP | 2006074277 | 3/2006 |
| JP | 2007165953 | 6/2007 |
| JP | 2007324677 | 12/2007 |
| WO | WO-2007086029 | 8/2007 |
| WO | WO-2007102403 | 9/2007 |

OTHER PUBLICATIONS

Skoric et al., "Symmetric Tardos fingerprinting codes for arbitrary alphabet sizes", Nov. 2007, Des. Codes Cryptogr, 137-166.*
He et al., "Joint Coding and Embedding Techniques for Multimedia Fingerprinting", IEEE Transactions on Information Forensics and Security, vol. 1, No. 2, Jun. 2006, pp. 231-247.
Li-Gang et al: "A Guess for the Open Problem of a Complex Orthogonal Space-Time Block Code for 8 Transmit Antennas," 2005 Second Int'l. Conference on Mobile Technology, Applications and Systems, Guangzhou, China, IEEE, Nov. 15-17, 2005, pp. 1-4.
Wu et al., "Collusion-Resistant Fingerprinting for Multimedia", IEEE Signal Processing Magazine, vol. 21, No. 2, Piscataway, NJ, Mar. 1, 2004, pp. 15-27.
Boneh et al., "Collision-Secure Fingerprinting for Digital Data," Princeton University, Dept. of Computer Science, Princeton, New Jersey, 1996.
Cha et al., "Advanced Colluder Detection Techniques for Osift-Based Hiding Codes", ISCAS 2008, IEEE, pp. 2961-2964.
He et al., "Improving Collusion Resistance of Error Correcting Code Based Multimedia Fingerprinting," 2005 IEEE ICASSP, Piscataway, NJ, vol. 2, Mar. 18-23, 2005, pp. II-1029-II-1032.
Galand, "Practical Construction Against Theoretical Approach in Fingerprinting," 2006 IEEE Int'l. Symposium on Information Theory, 14 pages, Jul. 9-14, 2006, Seattle, WA.
Huang et al., "Anti-Collision Fingerprinting Scheme Based on Error Correction Ability of Nonlinear Combinatorial Code," Proceedings of SPIE, vol. 6577, Texas, pp. 657701-1-657701-8, Apr. 27, 2007.
Lu et al., "Resistance of Content-Dependent Video Watermarking to Watermark-Estimation Attacks," IEEE Int'l Conference on Communications, vol. 3, Jun. 20-24, 2004, Paris, France, pp. 1386-1390.
Schaathun, "Attack Analysis for He & Wu's Joint Watermarking/Fingerprinting Scheme", University of Surrey, Jul. 1, 2006.
Tardos, "Optimal Probabilistic Fingerprint Codes", STOC '03, San Diego, California, Jun. 9-11, 2003, pp. 116-125.
Trappe et al., "Anti-Collusion Codes: Multi-User and Multimedia Perspectives," IEEE ICIP 2002, Sep. 22-25, 2002, pp. II-149-II-152.
Trappe et al., "Anti-Collusion Fingerprinting for Multimedia", IEEE Transactions on Signal Processing, vol. 51, No. 4, Apr. 2003, pp. 1069-1087.
Wang et al., "Anti-Collusion Forensics of Multimedia Fingerprinting Using Orthogonal Modulation," IEEE Transactions on Image Processing, vol. 14, No. 6, Jun. 2005, pp. 804-821.
Search Report dated !. Dec. 19, 2008.

* cited by examiner

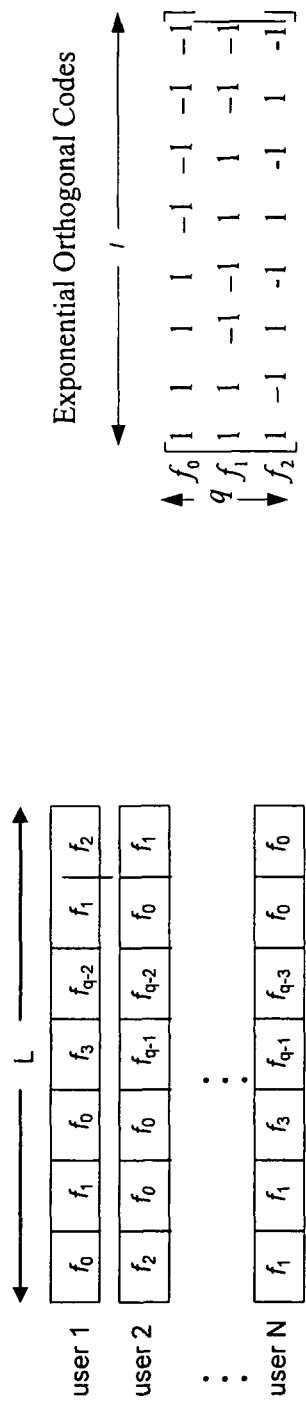
Fig. 3a
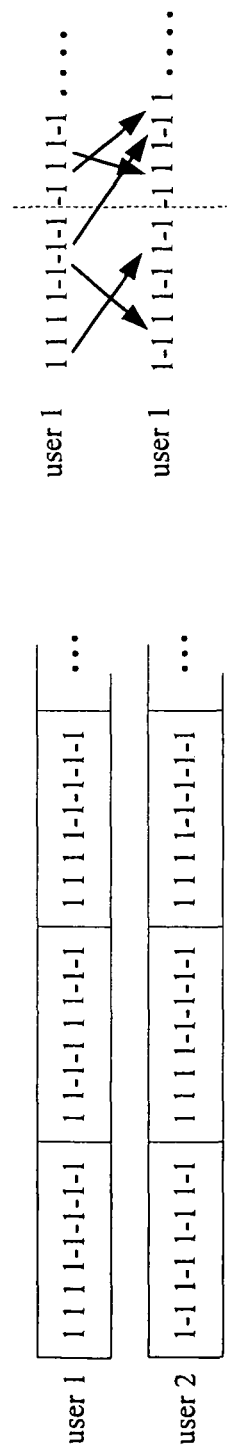
Fig. 3b
Fig. 3c
Fig. 3d $$H_8 = \begin{bmatrix} 1 & 1 & 1 & 1 & 1 & 1 & 1 & 1 \\ 1 & 1 & 1 & 1 & -1 & -1 & -1 & -1 \\ 1 & 1 & -1 & -1 & 1 & 1 & -1 & -1 \\ 1 & 1 & -1 & -1 & -1 & -1 & 1 & 1 \\ -1 & 1 & -1 & 1 & -1 & 1 & -1 & 1 \\ -1 & 1 & -1 & 1 & 1 & -1 & 1 & -1 \\ -1 & 1 & 1 & -1 & -1 & 1 & 1 & -1 \\ -1 & 1 & 1 & -1 & 1 & -1 & -1 & 1 \end{bmatrix}$$

Row-permuted $H_8$ $$\begin{bmatrix} 1 & 1 & 1 & 1 & -1 & -1 & -1 & -1 \\ -1 & 1 & 1 & -1 & 1 & -1 & -1 & 1 \\ -1 & 1 & -1 & 1 & 1 & -1 & 1 & -1 \\ -1 & 1 & -1 & 1 & -1 & 1 & -1 & 1 \\ 1 & 1 & -1 & -1 & -1 & -1 & 1 & 1 \\ 1 & 1 & -1 & -1 & 1 & 1 & -1 & -1 \\ -1 & 1 & 1 & -1 & -1 & 1 & 1 & -1 \\ 1 & 1 & 1 & 1 & 1 & 1 & 1 & 1 \end{bmatrix}$$

Fig. 5a

$$\begin{array}{r}\phantom{\text{Colluders}}\overset{H^{(1)}\times y^{(j)T}\ldots\ldots\phantom{xxxxx}H^{(5)}\times y^{(j)T}\phantom{x}G\times y^{(j)T}\phantom{x}T_i^{(j)}}{\phantom{x}}\\\text{Colluders}\begin{bmatrix}0 & 0 & 0 & 0 & 0\\0 & 0 & 0 & 0 & 0\\0 & 0 & 0 & 0 & 0\\\hline 0 & 0 & 8 & 0 & 0\\0 & 0 & 0 & 0 & 8\\8 & 0 & 0 & 0 & 0\\0 & 0 & 8 & 0 & 0\\0 & 8 & 0 & 0 & 0\end{bmatrix}\begin{matrix}0 & \sqrt{40}/5\\0 & \sqrt{40}/5\\0 & \sqrt{40}/5\\8 & 0\\8 & 0\\8 & 0\\8 & 0\\8 & 0\end{matrix}\\\text{Innocent users}\phantom{xxxxxxxxxxxxx}\end{array}$$

Fig. 6

METHOD FOR PROTECTING DIGITAL CONTENT AGAINST MINORITY COLLUSION ATTACKS

This application claims the benefit, under 35 U.S.C. §365 of International Application PCT/US2008/011209, filed Sep. 26, 2008 which was published in accordance with PCT Article 21(2) on Apr. 1, 2010 in English.

FIELD

The present invention relates to watermarking of digital content and in particular protecting digital content watermarks against minority collusion attacks.

BACKGROUND

Watermarking of multimedia content (still imagery, motion imagery, or audio) is the process of modifying the digital content in order to embed information into the content and the corresponding process of recovering that information from the modified content. One example of such watermark information is a digital forensic code added or embedded to digital multimedia content, such as digital audio or digital video, after production and before or during distribution. In this case, the watermark or digital forensic code is intended to apply a unique identifier to each of many copies of a multimedia work that are otherwise identical. In one application, this can be used to identify the source of an illegally copied digital multimedia item. Watermarking digital content of multimedia applications, such as digital video and digital audio, is one technique to deter thieves from misappropriating a copy of the work and then illegally redistributing it. This technique also encourages authorized distributors of digital content to maintain high security standards because watermarking can identify the specific authorized dealer from which the misappropriated copy originated. For example, if an illegal copy of digital content is confiscated, the watermark information within the digital content can be used to determine the identity of the authorized distributor and, perhaps, the time and place of the public showing of the digital content by the authorized distributor via the use of serial numbers in the forensic code. With this information, an investigation can begin at the identified authorized distributor to determine the conditions under which the misappropriation occurred.

In many applications, a unit of digitally watermarked content may undergo some modification between the time it is embedded and the time it is detected. These modifications are named "attacks" because they generally degrade the watermark and render its detection more difficult. If the attack is expected to occur naturally during the process of authorized or unauthorized distribution, then, the attack is considered "non-intentional". Examples of non-intentional attacks can be: (1) a watermarked image that is cropped, scaled, JPEG compressed, filtered etc. (2) a watermarked digital product that is converted to NTSC/PAL SECAM for viewing on a television display, MPEG or DIVX compressed, re-sampled etc. On the other hand, if the attack is deliberately done with the intention of thwarting the purpose of the watermark, then the attack is "intentional", and the party performing the attack is a thief or pirate. The three classes of intentional attack are unauthorized embedding, unauthorized detection, and unauthorized removal. This invention is concerned with unauthorized removal; removing the watermark or impairing its detection (i.e. the watermark is still in the content but cannot be easily retrieved by the detector). Unauthorized removal attacks generally have the goal of making the watermark unreadable while minimizing the perceptual damage to the content. Examples of attacks can be small, imperceptible combinations of line removals/additions and/or local rotation/scaling applied to the content to make difficult its synchronization with the detector (many watermark detectors are sensitive to de-synchronization).

One type of attack is a collusion attack where different copies of the same content are combined in an attempt to disguise or scramble the different watermark information contained in each. It would be useful to develop a technique to accurately retrieve the digital watermark information from pirated digital content where collusion has attempted to disrupt the watermark information.

SUMMARY

A method of generating watermark codewords is presented which enables accurate detection of one or more colluders that produce a colluded digital product exhibiting a minority-type collusion attack. The codeword generation process includes generating a square matrix whose rows are mutually orthogonal. Such a square, mutually orthogonal matrix is a Hadamard matrix. Permutations on the rows of the square matrix are produced. Many such permutations are generated. The rows of the aggregate concatenation of the permuted square matrices are used as inner codes. An outer code is also used in the construction of an improved Error Correcting Code-based scheme. The combination of the inner code and outer code are the codewords for digital watermarking.

An adaptive detector apparatus is useful to detect one of the three or more colluders in a minority collusion attack of three or more colluders, or one of the three or more colluders in a majority collusion attack, and one of the two or more colluders in an interleaving collusion attack. The overall performance of the adaptive detector under minority, majority, and interleaving attacks is detection of one of the two or more colluders that present a collusion attack on a digital product/content, such as a digital multimedia product, that is watermarked with the above row-permutated Hadamard-based inner codes. The adaptive detector includes an input buffer accepting the watermark information extracted from a digital product/content exposed to a collusion attack. The apparatus executes computer instructions that extract codewords from the colluded digital product/content. The apparatus uses statistical features of the extracted codeword to determine the most probable set of colluders that produced the colluded digital product/content under test. The processed codewords identify at least one of the two or more codewords corresponding to two or more known users whose codewords are used to produce the watermark information from the digital product/content exposed to the collusion attack.

Additional features and advantages of the invention will be made apparent from the following detailed description of illustrative embodiments which proceeds with reference to the accompanying figures.

BRIEF DESCRIPTION OF THE DRAWINGS

FIG. 3a depicts an example outer code for an ECC-based encoder;

FIG. 3b depicts an orthogonal inner code for an ECC-based encoder;

FIG. 3c depicts a combination of an inner code into and outer code;

FIG. 3d depicts a randomization for an ECC-based encoder mechanism;

FIG. 5a depicts an example row-permutation of a Hadamard Matrix according to aspects of the invention;

FIG. 6 depicts an example calculation of a matrix $T_i^{(i)}$ according to aspects of the invention;

DETAILED DISCUSSION OF THE EMBODIMENTS

Figure 1:
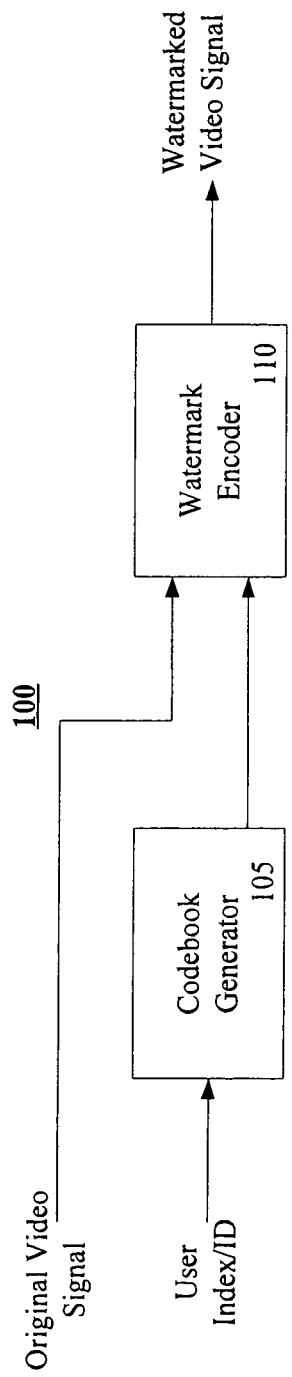
FIG. 1 illustrates a watermark embedding process.

As used herein, "/" denotes alternative names for the same or similar components or structures. That is, a "/" can be taken as meaning "or" as used herein. A digital forensic code/watermark can be employed in a technique for identifying users who misappropriate multimedia content for illegal distribution. These forensic codes/watermarks are typically embedded into the content using watermarking techniques that are designed to be robust to a variety of attacks. One type of attack against such digital forensic codes is collusion, in which several differently marked copies of the same content are combined to disrupt the underlying forensic watermark which identifies an authorized source of the digital multimedia content. A special challenge in multimedia forensic codes design is that when the protected data is multimedia, the colluders usually apply post-processing after collusion that forms an erroneous channel. For instance, the colluders can compress the multimedia to reduce the data size before redistributing the colluded copy. Therefore, it is important to design a collusion-resistant forensic code that is robust to channel error.

There are three popular anti-collusion forensic marking schemes. The first anti-collusion code is known as the Boneh and Shaw (BS) code and is described in D. Boneh and J. Shaw, "Collusion-secure fingerprinting for digital data," IEEE Transactions on Information Theory, vol. 44, no. 5, pp. 1897-1905, Sep. 1998. The second anti-collusion code is known as the Tardos code and is described in G. Tardos, "Optimal probabilistic fingerprint codes", in Proceedings of the 35th Annual ACM Symposium on Theory of Computing, 2003, pp. 116-140. The third anti-collusion marking scheme is known as the error correcting code (ECC) based marking and is described in S. He and M. Wu, "Joint coding and embedding techniques for multimedia fingerprinting," IEEE Transactions on Information Forensics and Security, vol. 1, no. 2, pp. 231-247, June. 2006. Extending this framework by using orthogonal inner codes to modulate ECC alphabets, a basic ECC-based forensic code is obtained.

The BS code has the drawback of long code length and low collusion resistance against a collusion having only a few colluders. Although the Tardos code gives the best collusion resistance under a binary symmetric channel (BSC), it also has four orders of magnitude higher computational complexity and four orders of magnitude higher storage consumption than either the basic ECC or BS code designs. The basic ECC design appears more preferable than the BS code since the basic ECC code provides higher probability of detection under the worst case scenario. Overall, the basic ECC code is a promising scheme for practical applications where computation and storage resources are limited. A drawback of the basic ECC code is the low collusion resistance under BSC compared with Tardos code. In one aspect of the present invention, an improvement to the collusion-resistant performance of the basic ECC code (creating an improved ECC) under BSC is presented.

Generally, there are three types of collusion attacks; interleaving, majority and minority. In an interleaving attack, the colluders contribute copies of their forensic data on a bit by bit basis in roughly equal shares in an effort to evade valid forensic code/watermark detection. This type of attack can commence when there are two or more colluding users. This method threatens to result in a false positive detection of an innocent authorized distributor as one source of the misappropriated copy of the protected digital content. In a majority attack, the colluders combine their forensic data on a bit by bit basis such that the majority of bit states among the colluders is selected and placed in the final colluded copy of the protected digital content. This type of attack can commence when there are three or more colluding users. This method can also produce false positive results in forensic code word detection. The minority attack is targeted to reduce a correlation-based detector's chance of valid detection by choosing bits of the forensic codeword that represents the fewest colluders' codeword bits. Thus, the probability of detection error is increased. This type of attack can commence when there are three or more colluding users. The present invention addresses a minority attack detection solution that also works for interleaving and majority type collusion attacks.

FIG. 1 depicts a block diagram of a forensic codeword/watermark embedding system 100 implemented using a computing system. Initially, the codeword for each user is generated and stored in a codebook. In one embodiment, the codebook is digital information representing some or all of the codewords for authorized users of a digital content/product. Based on the input user index/ID (identifier), the codeword for an identified user is generated 105. Such codeword generation can be performed by retrieving data stored in a memory or it can be generated when the watermarking process is started. The user codeword is then combined with the original digital content signal in an encoder 110. The result of encoding is a watermarked digital content signal where the codeword is embedded into the original digital content signal. The output of encoder 110 is a watermarked digital content signal for distribution by the corresponding authorized user.

Figure 2:
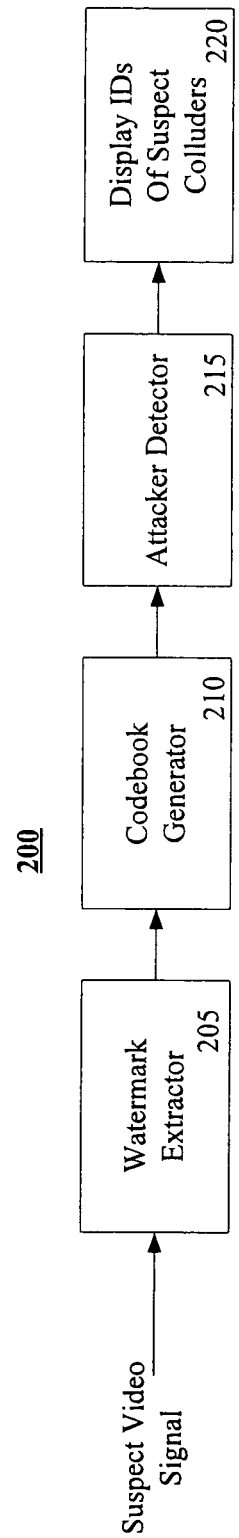
FIG. 2 illustrates a watermark detection process.

FIG. 2 shows a general code detector 200 of a watermark/forensic code. The general code detector 200 may be implemented on a computer system for generation and display of results. Initially, a suspect digital content signal is input into a forensic code/watermark extractor 205. Watermark information from the suspect digital content is extracted. All of the user codewords are generated by the codeword generator 210. This codeword generator can be a similar device to that shown in FIG. 1, item 105. An attacker detector 210 then detects codewords of the attackers and the codewords are compared with the list of all codewords to determine the attacker identities. The identities of suspected colluders can be displayed 220. Such a display includes, but is not limited to display on a terminal/monitor or a printing device. In this instance, a user is an authorized user of the encoded digital content. For example, the user could be an authorized distributor of a digital content product, such as a movie. If a pirated digital product is uncovered, then one or more of the authorized users having codewords that correspond to the codewords in the suspect digital product may be colluders. Here, the term colluder refers to an authorized user that allowed a copy of the digital product fall into the hands of digital product pirates/thieves.

FIGS. 3a-3d depict a general method of generating a basic ECC-based forensic code. The first step of FIG. 3a is to generate an ECC outer code for N users with L symbols and q alphabets $\{f_0, f_1, \ldots, f_{q-1}\}$. In one embodiment, the outer code of FIG. 3a is constructed as a Reed-Solomon code due to its large minimum distance. FIG. 3b depicts example binary inner codes to be used as alphabets for a basic ECC where zeros are depicted as −1 values. FIG. 3c shows the result of substitution of the inner codes of FIG. 3b into the outer codes of FIG. 3a for each user. This is a one way to generate a basic ECC codeword for a user. In one embodiment, the basic ECC codeword can be further manipulated by randomly permuting the bits for each user. FIG. 3d depicts a random permutation of the codeword bits of FIG. 3c for user 1. This "random" permutation may be conducted by a randomizer and is generally performed to prevent the codeword structure from being broken down by attackers. The result after the operation of FIG. 3d is a randomized basic ECC codeword for each user.

Referring back to FIG. 3b and the inner codes, the q orthogonal binary inner codes with value +1/−1 and length l are used to modulate the q alphabets and substitute the inner code into the outer code. The overall code length is Ll bits and the total number of users is $N=q^t$, where t is the dimension of the outer Reed-Solomon code. The orthogonal inner codes are designed to reserve the colluders' information as much as possible. For q orthogonal vectors, the q inner codes list all the $2^q$ possible combinations of 1 and −1, thus have code length $l=2^q$. The orthogonal inner codes shown in FIG. 3b for the basic ECC are constructed as follows. For the $i^{th}$ codeword $f_{i-1}$, the first $2^{q-1}$ bits are 1s and the next $2^{q-1}$ are −1s. Then the same code is repeated $2^{i-1}$ times, ending up with $2^q$ bits. The inner code matrix of q=3 is shown in FIG. 3b. The first 4 bits of the first codeword $f_0$ are 1s and the rest bits are −1s; the first 2 bits of the second codeword $f_1$ are 1s and the next 2 are −1s, and then the code pattern is repeated once. This produces an inner code for a basic ECC codeword.

Figure 4:
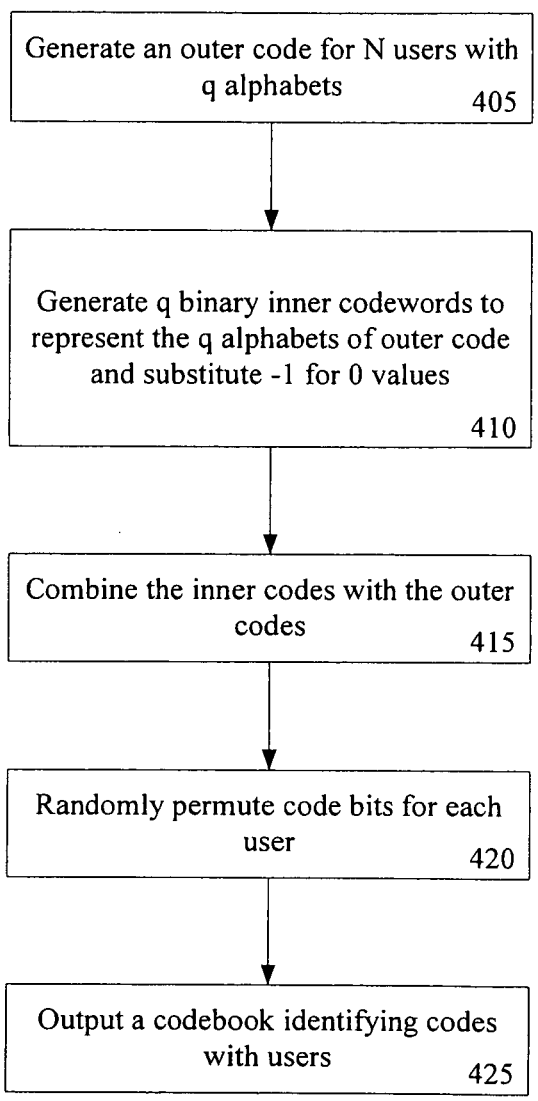
FIG. 4 depicts generation of an ECC-based code according to aspects of the invention.

FIG. 4 depicts the process 400 of generating a forensic codebook of users using an ECC-based process. This process 400 is useful for both the basic ECC and for the improved ECC that is an aspect of the current invention. The process 400 follows the process depicted in FIGS. 3a-d. At step 405, an outer code, such as a Reed Solomon code, is generated for N users with q alphabets. Generally, an input parameter for generation of an outer code includes the number of users, the alphabet size q, and the desired outer code length. At step 410, the inner code is generated. Here, q binary inner codewords are generated to represent the q alphabets of the outer code. Values of −1 are used for zero states to accommodate the algorithms used. Generally, an input parameter for generation of an inner code includes the alphabet size q and the overall length of the desired inner code. At step 415, the inner codes are combined with the outer codes. In one embodiment, the inner codes are substituted into the outer code. At step 420, the resulting inner and outer code is randomly permuted according to a known randomization algorithm for each user. Thus, a bit-level randomization is applied for each user. The resulting codeword for each authorized user is essentially used as one of the entries for that user in a codebook of user forensic codes. This codebook is then useful in a detection process to uncover attackers/colluders in an unauthorized digital content distribution scheme. Step 425 outputs either a single codeword or an entire codebook which can be used to correspond to authorized users.

In one embodiment, a correlation-based detector is employed in the ECC forensic code scheme to detect user's codewords to identify colluders. If y is the forensic code extracted from the colluded copy, and $x_i$ is the forensic code of user i, and U is the set of all users. Then the detection statistic of user i is $$T_i = \sum_{j=1}^{L} T_i^{(j)}/L, \quad (1)$$

$$\text{with } T_i^{(j)} = \frac{<y^{(j)}, x_i^{(j)}>}{\|x_i^{(j)}\|}, \quad (2)$$

where $x_i^{(j)}$ and $y^{(j)}$ are the codewords corresponding to the $j^{th}$ symbol of $x_i$ and y, respectively. In a maximum value detector, user i may be accused as a colluder if he/she has the highest detection statistic, i.e. $T_i \geq T_k \ \forall k \in U$. In a threshold value detector, user i may be accused as a colluder if his/her detection statistic is greater than a threshold h, i.e. $T_i \geq h$. Detection using formula (1) above may be termed a soft detector.

In one embodiment, a correlation-based detector is employed in the ECC forensic code where a minority-type collusion attack is placed against watermarked digital content. The minority attack by c colluders for a ±1 binary forensic code is formulated as follows:

$$y_j = \begin{cases} -1, & \text{if \# of } -1\text{ s} \leq \text{ \# of 1 s in all the } c \text{ copies at position } j \\ 1 & \text{otherwise} \end{cases}$$

One rational behind a minority attack is that the colluders know that a correlation-based detector will be used to attempt to detect and identify the colluders. In a minority attack detection, the correlation-based detector collects each attacker's trace from every code bit of the colluded copy of digital content. Knowing this, the colluders choose the bit at each position in the colluder's codewords that appears the fewest number of times. This may then have the effect of effectively reducing the correlation determined by a correlation-based detector and thus increase the probability of detection error.

One characteristic of the basic ECC forensic code design is that it is vulnerable to minority attack by three colluders even when the bit error rate (BER) is 0. This is explained by the following theorem. Given any three binary orthogonal codes $x_1, x_2, x_3$, which take values of ±1, the minority-colluded code y is orthogonal to $x_1, x_2$, and $x_3$. Or equivalently, $<y, x_1> = <y, x_3> = 0$. This can be proven by letting 1 be the code length and $x_1(i), x_2(i), x_3(i)$, and y(i) be the $i^{th}$ bit of $x_1, x_2, x_3$, and y, respectively. $x_1(i)$ can either be the minority or majority among $x_1(i), x_2(i)$, and $x_3(i)$, or $x_1(i)=x_2(i)=x_3(i)$. If $x_1(i)$ is the minority, then $y(i)=x_1(i)$, thus $y(i)*x_1(i)=1$. Furthermore, by Dirichlet's drawer principle, since $x_1(i)$ is the minority, $x_2(i)$ must be equal to $x_3(i)$. Therefore, $x_2(i)*x_3(i)=y(i)*x_1(i)=1$.

Similarly, if $x_1(i)$ is the majority, then $y(i)=-x_1(i)$, and $x_2(i)=-x_3(i)$. Thus $x_2(i)*x_3(i)=y(i)*x_1(i)=-1$. If $x_1(i)=x_2(i)=x_3(i)$, apparently $y(i)=x_2(i)=x_3(i)$, and $x_2(i)*x_3(i)=y(i)*x_1(i)=1$. Hence, $x_2(i)*x_3(i)=y(i)*x_1(i)$ for all $1 \leq i \leq l$, and since $$<y, x_1> = \sum_{i=1}^{l} y(i)*x_1(i),$$

$<y, x_1> = <y, x_3> = 0$. The same proof can be applied to $<y, x_2> = <y, x_3> = 0$.

Based on the above theorem, the minority-colluded forensic marking code of any binary orthogonal forensic codes with the basic ECC correlation-based detector is always orthogonal to the colluders' forensic codes when the number of colluders is 3. Therefore, using the basic ECC design discussed above, the detection statistics of the colluders will be very low since information about the colluders is lost in the symbol positions where the colluders have three different inner codes. Thus the collusion-resistance of the basic ECC forensic codes degrades when the colluders apply a minority attack strategy. The basic ECC design is generally incapable of accurately detecting three colluders in a minority attack. The present invention addresses this detection fault of the basic ECC codeword design.

A Hadamard matrix can be used to generate the inner codes used in the basic ECC design. A Hadamard matrix is a square matrix whose entries are either +1 or −1 and whose rows are mutually orthogonal. In general, every two different rows in a Hadamard matrix represent two perpendicular vectors. The Hadamard matrix is a $q_c \times q_c$ orthogonal matrix which exists when $q_c=2^m$ and m is an integer. A Hadamard matrix $H_{q_c}$ with order $q_c$ can be generated recursively by $$H_{q_c} = \begin{bmatrix} H_{q_c/2} & H_{q_c/2} \\ H_{q_c/2} & -H_{q_c/2} \end{bmatrix}, \text{ with } H_2 = \begin{bmatrix} 1 & 1 \\ 1 & -1 \end{bmatrix}$$

Given any three rows $\{r_1, r_2, r_3\}$ in a Hadamard matrix $H_n$ with order n, $4 \le n \le 32$, and letting the bitwise minority of the three rows be y, there exists one and only one row, $x \in H_n \setminus \{r_1, r_2, r_3\}$, such that y=x. Thus, if the standard Hadamard matrix is used for inner orthogonal code generation, the resulting minority-colluded forensic code will always generate a false-positive result (i.e. wrongly identifying an innocent user). As a result, one innocent user could be accused of collusion when the three codewords of the colluders are different. However, as an aspect of the current invention, a modification in the generation of inner codes using a Hadamard matrix is possible to avoid the false-positive result experienced when using a standard Hadamard matrix in a basic ECC inner code design. The modification and improvement of the inner code design of the current invention involves a random permutation of the Hadamard matrix to obtain orthogonal inner codes useful to distinguish colluders from innocent users in a minority collusion attack.

Figure 5:
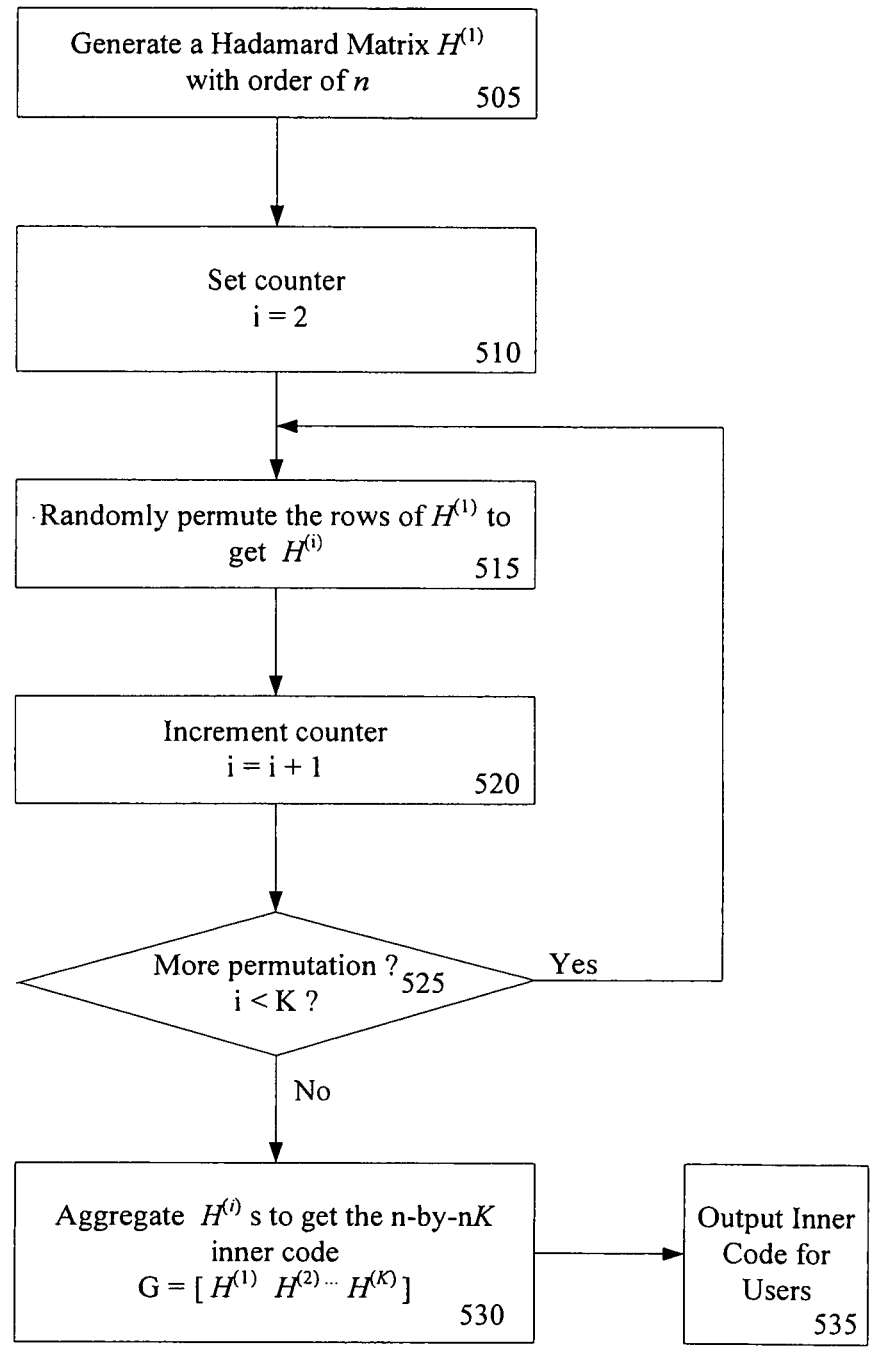
FIG. 5 depicts generation of a row-permuted orthogonal inner code according to aspects of the invention.

FIG. 5 illustrates an example process 500 of generating an orthogonal inner code with n rows and nK columns according to aspects of the present invention using the concatenation of a set of row-permuted Hadamard matrices. A Hadamard matrix $H^{(1)}$ with order n is generated at step 505. An index/counter is set at step 510 to control the number of iterations. A random permutation of the rows of the Hadamard matrix $H^{(1)}$ is then performed to generate a row-level permuted Hadamard matrix $H^{(1)}$ in step 515. This is further depicted in FIG. 5a which depicts an 8×8 Hadamard matrix. In FIG. 5a, row level permutations are applied to the Hadamard matrix $H_8$ to produce a row-permuted matrix $H_8$ according to an aspect of the invention. Although FIG. 5a depicts only a first permutation of matrix $H_8$, many such permutations of $H_8$ are normally accomplished according to aspects of the invention. The number of permutation matrices can be determined based on the desired length of the inner codeword. Permuting a greater number of Hadamard matrices produces a longer length inner codeword. The number of Hadamard matrix permutations of the inner code can be accomplished using a fixed, exhaustive, or random mapping. A fixed mapping may be a known set of permutations. The exhaustive mapping is all possible permutations of the Hadamard matrix rows. A random permutation includes a number of permutations generated by either a random or a pseudo-random means.

Returning to FIG. 5, after the Hadamard matrix $H^{(1)}$ is row-permuted to acquire $H^{(2)}$, which is the next permutation of $H^{(1)}$, then the index/counter is incremented in step 520. The decision step 525 allows the process 500 to execute the random permutation of step 515 K times and obtain K−1 permuted versions of the Hadamard matrix $H^{(1)}$. The permuted Hadamard matrices form a series of Hadamard matrices such as $H^{(2)} H^{(3)} \ldots H^{(K)}$. When K−1 permuted Hadamard matrices are formed, then step 525 completes and the process 500 moves to step 530. At step 530, the final inner code G is the aggregation of all the matrices $H^{(i)}$, i.e. $G=[H^{(1)} H^{(2)} H^{(3)} \ldots H^{(K)}]$ and $H^{(i)} \ne H^{(j)}$ $\forall 1 \le i, j \le K$, $i \ne j$. This aggregation may be viewed as a concatenation of the Hadamard matrices; the concatenation forming the inner code for the ECC code In general, the longer the inner code length, the better the detection properties in colluded digital content. The results of step 530 may also be displayed or printed out using a computer system for visual inspection by an operator wishing to see the generated inner code for one or more authorized users. Further, the generation of improved ECC inner codes as described above allows insertion of the improved inner codes into a digital product as a watermark. The improved inner codes described above can also be inserted into an outer code as in FIG. 4 for use in a digital watermarking process for a digital product.

In one example of the use of the improved inner code presented above, assume that there are 3 colluders mounting a minority attack. Without loss of generality, attention is given to one symbol position where y is the colluded forensic code at that symbol position. Considering the inner code, if K is large enough, every innocent user would be detected in K/(n−3) matrices among all $H^{(i)}$, $1 \le i \le K$. Thus, the expectation value of the correlation between test signal y and the forensic code for an innocent user x is $\langle y, x \rangle = Kn/(n-3)$. Meanwhile, the correlation between y and the forensic code of any colluder stays at 0. Therefore, the colluders can be detected by the difference of the detection statistics, which is 0 for colluders and $Kn/((n-3)\sqrt{l})$ for innocent users, where l is the code length of inner codes and K=l/n. Since the difference of the expectation of the detection statistics of colluders and innocent users becomes larger when K increases, the longer the inner code is, the better the collusion-resistance of ECC based forensic code is against minority attack.

Figure 5B:
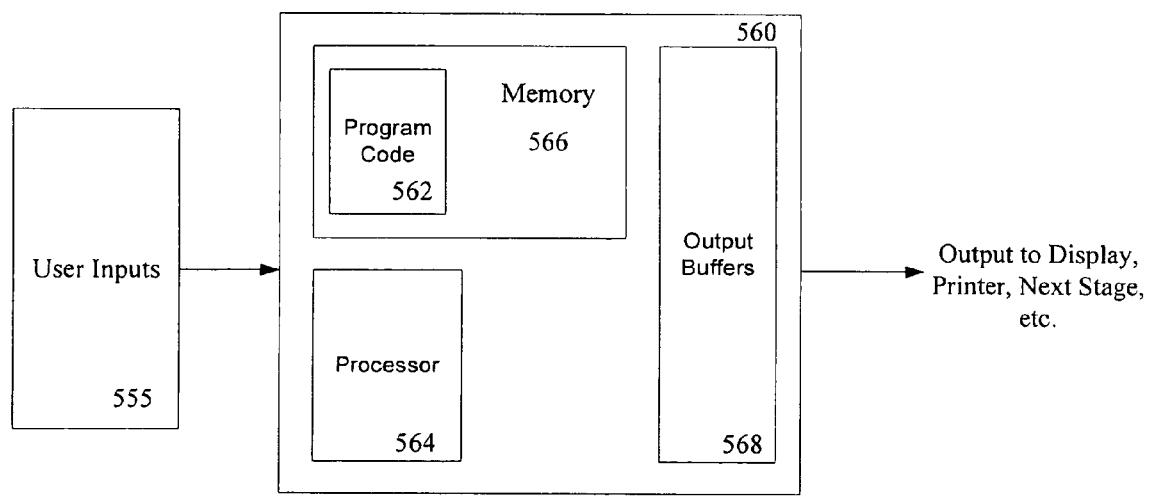
FIG. 5b depicts a codebook generator according to aspects of the invention.

One of skill in the art will recognize that the inner code generation method of FIG. 5 may be used in conjunction with a system of the type shown in FIG. 1 to generate an inner code, an outer code (if needed), and encode a watermark on a digital product, such as a digital content product. This is accomplished because the method of FIG. 5 may be used to generate a codeword or codebook of codewords of users for identification of users with copies of the digital product. FIG. 5b depicts a system 550 that generates a codebook using the principles of the present invention. The codebook generation device 560 receives inputs 555 from a system 550 user. Those inputs include inputs needed to generate both an outer code and an inner code. For an outer code definition, such as a Reed Solomon code, the input parameters entered by a system 550 user include the number of intended digital content/product users (such as a distributor/user), the alphabet size (q), and the Reed Solomon code length (L). The input parameters for an inner code according to aspects of the invention include the alphabet size (q), and the total length of the inner codeword. The codeword generation device 560 includes a processor 564 having access to computer code 562 that contains computer instructions to generate an outer and inner code in accordance with the invention. The computer code may be in the form of fixed or removable computer-readable media such as magnetic, optical, or solid state memory. In one embodiment, the code resides in memory 566 which is accessible to the processor for not only the computer instructions, but may also be used by the computer for storage related to processing the codewords according to the needs of the computer code. The processor also has access to output buffers 568 useful to buffer and drive the generated codewords out of the device 560 and to a tangible embodiment such as a printer, a display, or, in the case of a system such as in FIG. 1 or 2, a downstream stage that will use the codeword in either an encoding or detection process. As is well understood by those of skill in the art, the embodiment of FIG. 5b is not limiting because many variations of hardware and software or firmware implementations are possible within the scope and spirit of the present invention.

In order to realize the benefits of the improved inner code design of FIG. 5 for detection purposes, the detection statistics are redefined with regard to the $j^{th}$ symbol $T_i^{(j)}$ for user i. Stated another way, the detection statistic of formula (1) of the inner code design of the basic ECC design can be improved using the inner code design of the present invention. The idea is to use the difference between the detection statistics of user i and that of innocent users as the detection statistic. Let $T_{median}^{(j)}$ be the median value of $Gy^{(j)T}$, which is a vector containing the correlation between each inner codeword in G and the colluded code $y^{(j)}$. When the alphabet size is greater than twice the number of colluder symbols, which is mostly the case in practical applications, the median value of $Gy^{(j)T}$ will be very likely to belong to an innocent codeword. Thus, as an aspect of the present invention, the detection statistic for user i at symbol j $T_i^{(j)}$ is redefined as:

$$T_i^{(j)} = \left| \frac{<y^{(j)}, x_i^{(j)}> - T_{median}^{(j)}}{\sqrt{l}} \right|. \qquad (3)$$

An example calculation of the matrix of formula (3) above is given in FIG. 6, where $G=[H^{(1)}\ H^{(2)}\ H^{(3)}\ \ldots\ H^{(5)}]$, and where $H^{(k)}$ is a row-permuted Hadamard matrix with order 8. The matrix in FIG. 6 shows $[H^{(1)}\ H^{(2)}\ H^{(3)}\ \ldots\ H^{(5)}] \times y^{(j)T}$. From FIG. 6, the median of $G \times y^{(j)T}$ is 8, which comes from innocent codewords. Thus, by subtracting $T_{median}^{(j)}$ from $G \times y^{(j)T}$ and normalizing by $\sqrt{l}$, then the value of $T_i^{(j)}=0$ is obtained for innocent users, while the value of $T_i^{(j)}=\sqrt{40}/5$ is obtained for colluders. This example shows how the improved ECC design of the current invention is useful in a minority attack analysis to positively identify colluders and not innocent users. Thus, although the basic ECC design fails completely to detect any codewords in a minority attack with three colluders, the improved ECC design of the present invention can detect codewords of at least one and up to three colluders in a minority attack of three colluders and is thus a significant improvement over the basic ECC design.

Figure 7:
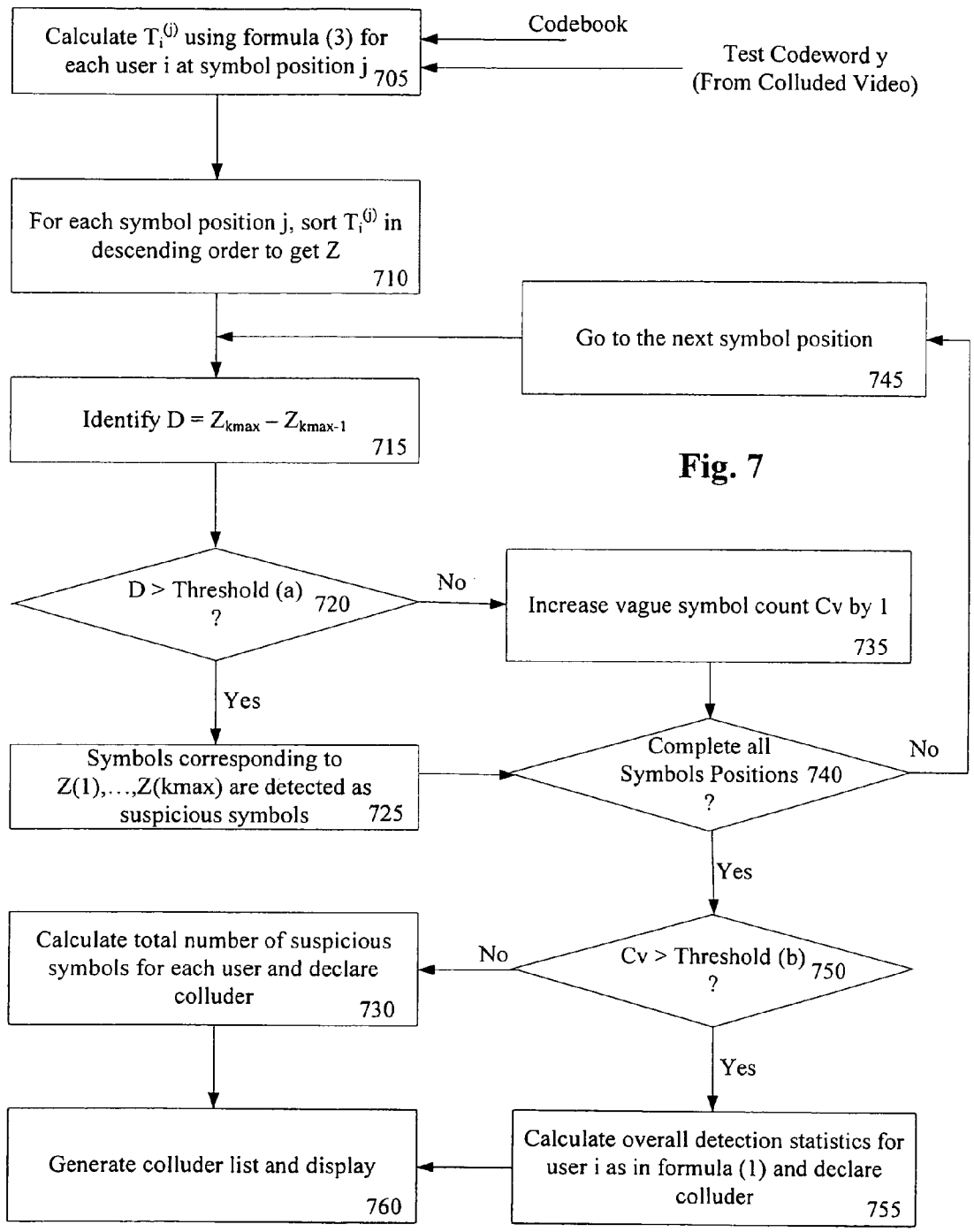
FIG. 7 depicts a flow diagram of an adaptive detector according to aspects of the invention.

Considering another aspect of the invention, an adaptive detector can be implemented to utilize both the enhanced detection capabilities of the improved ECC design statistics of formula (3) as well as the basic detection capabilities of the basic ECC design statistics of formula (1). If an innocent (non-colluding) user detection statistic is higher than that of colluder's statistics, then detection error is considered unacceptable. For example, it is possible, such as under minority attack, that using only the soft detector of formula (1) above may result in an innocent user being included in a group of actual colluders. To solve this problem, a hard detector may be used in conjunction with a soft detector of formula (1) according to an aspect of the invention. FIG. 7 depicts one embodiment of an example process for adaptive detection according to aspects of the present invention.

The process 700 of FIG. 7 is an adaptive detector in that it includes both a hard detector and a soft detector according to aspects of the invention. Attributes of a soft detector were discussed above with respect to formula (1). The hard detector is employed to detect suspicious symbols on each symbol position of the outer code. Then for each user, the number of symbols that are marked as suspicious are calculated. The user who has the largest number of suspicious symbols is chosen as the colluder. Referring to FIG. 7, a codebook of user codewords and a test codeword (y) derived from a sample of a colluded digital product/content under test is input into the process 700 at step 705. $T_i^{(j)}$, formula (3), is also calculated for each user at the $j^{th}$ symbol at step 705. Note that due to the outer code structure, users share symbols on every symbol position. $T_i^{(j)}$ is calculated for each symbol in the q alphabets. At step 710, the set $\{T_1^{(j)} T_2^{(j)} \ldots T_N^{(j)}\}$ is sorted for each position j in descending order to get a vector Z. At step 715, a value $D=Z(k)-Z(k+1)$ is calculated $\forall 1 \le k \le q-1$, where $Z(k)$ is the $k^{th}$ element of the sorted Z. Let the index k that gives the maximum of $Z(k)-Z(k+1)$ be $k_{max}$. At step 720, a decision is made as to whether a symbol is suspicious or if the statistic of formula (3) is vague based on a calculated value of D. If the value of D is greater than a threshold (a), then the symbol is suspicious and the process 700 moves from step 720 to step 725. If the value of D is not greater than a threshold (a), then the statistic of the symbol is vague and the process 700 moves from step 720 to step 735. In one instance, if a value D is assessed as $Z(k_{max})-Z(k_{max}+1) \le$ threshold (a), then no symbols are claimed as suspicious symbols at position j because the statistic is vague. In this instance, the process 700 moves from step 720 to step 735. But, if the value of $D=Z(k_{max})-Z(k_{max}+1)$, is assessed to be greater than a threshold (a), then symbols corresponding to $Z(1), \ldots, Z(k_{max})$ are declared as suspicious symbols and process 700 moves from step 720 to step 725.

At step 735, the $j^{th}$ symbol is marked or considered vague, and the vague symbol count Cv is incremented before moving to step 740. If the assessed value of D is greater than threshold (a), then step 725 is entered where the symbol is stored as a suspicious symbol before the process 700 moves to step 740. At step 740, a decision is made as to whether all of the symbol positions of the colluded codeword have been examined. If more symbols remain, then the process 700 moves from step 740 to step 745. At step 745, the next symbol position is examined. The process then moves to step 715. At some iteration, all of the symbols of a colluded codeword have been examined and the decision of step 740 moves to step 750.

At step 750, the decision as to whether to use a soft detector or a hard detector is made. If the number of vague symbols exceeds a threshold (b), then a hard detection cannot be made with reliability. As a result, if the number of vague symbols (Cv) exceeds threshold (b) as determined by step 750, then the soft detector of step 755 is used. At step 755, a calculation of the overall detection statistic for user i is determined using formula (1) to determine the colluder's statistics. Threshold (b) is a parameter defined by a detection process 700 user and can be different for different symbol positions. In one embodiment, threshold (b) may be selected by the detection system 700 from a list of thresholds dependent upon the number of colluders and outer-code correlation parameters. For instance, if the outer-code correlation is 3/31, L=31, and the number of colluders is 5, according to our experiment the innocent user can have up to 15 suspicious symbols, while the colluders should have at least 27 suspicious symbols. Therefore, threshold (b) can be set to be less than 12 to guarantee hard detector accuracy.

Returning to step 750 if the number of vague symbols does not exceed a threshold (b), then a hard detection can be used and the process 700 moves from step 750 to step 730. At step 730, the total number of suspicious symbols for each user is calculated and colluders are identified in a hard detection. Both steps 755 and 730 enter step 760 which accumulates the results and displays the discovered list of colluders. Step 760 collects the colluder statistics and compares the codebook entries against the collusion codeword results. Accordingly, a list of colluders that correspond to the collusion codewords is generated. Step 760 then generates a display, printout, or other form of tangible output to provide output information resulting from process 700 concerning the detection of colluder information contained in the digital content under test. The output of step 760 allows the display of the codewords collected from step 730 (hard detector), step 755 (soft detector), and a comparison of those codewords using the codebook input. The codebook codewords being codewords of known authorized users. In process 700, the results of steps 730, 755, and 760 provide processed codeword information that correspond to the codewords of authorized users that the process 700 identifies as colluders of the colluded digital product.

Although the hard detector works well under the conditions of a minority attack of small number of colluders (three or more), it is not as robust as the soft detector under other collusion attacks, such as a majority attack and an interleaving attack, when the number of colluders increases. Therefore, the forensic detector is designed to function adaptively and switch between the hard detector and the soft detector based on the information detected in the sample colluded watermark from the colluded digital content input into the detector system.

Note that the hard detector performance depends on whether the suspicious inner codes of each symbol are detected successfully. It can be reasonably foreseen that the hard detector may not work well if the number of vague symbols is too large, while the soft detector can perform better since it contains more information. The adaptive detector represented functionally in FIG. 7 achieves this flexibility. Overall, the adaptive detector can detect at least one and up to three of the three or more colluders in a minority type collusion attack of three or more colluders, one of the three or more colluders in a majority type collusion attack, or one of the two or more colluders in an interleaving type collusion attack.

Figure 8:
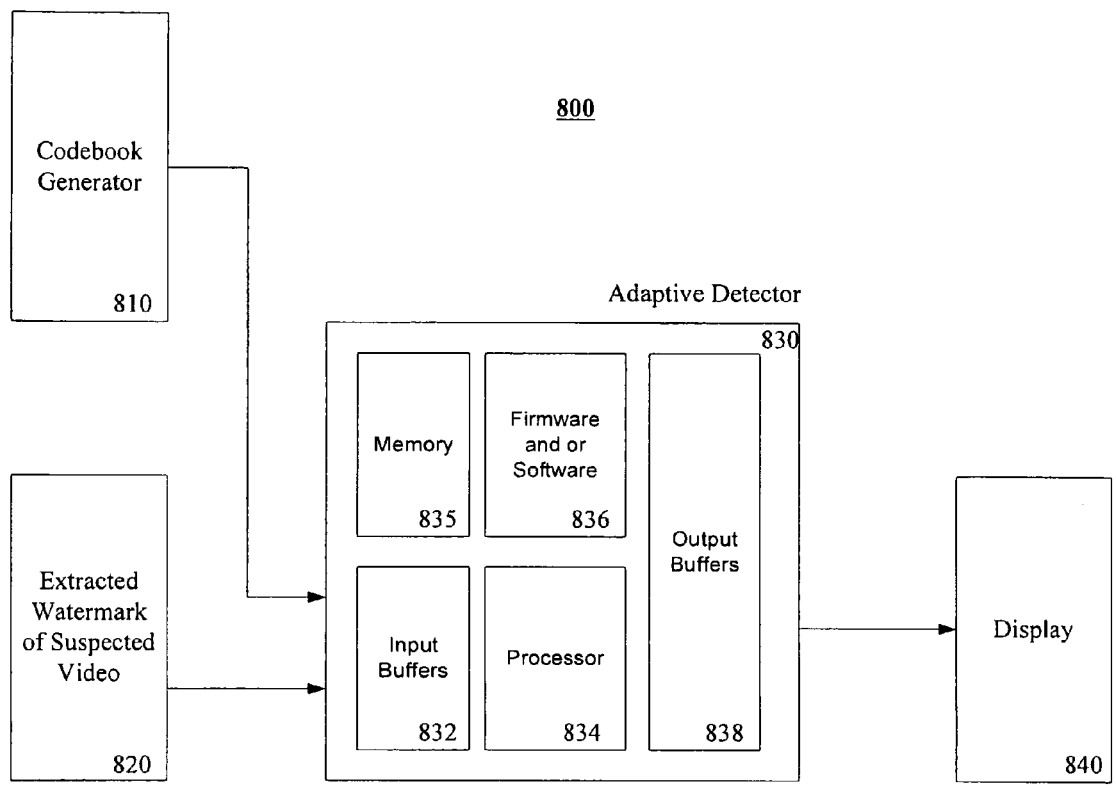
FIG. 8 depicts a block diagram of an adaptive detector system according to aspects of the invention.

FIG. 8 depicts an embodiment of an adaptive detector system 800. The adaptive detector apparatus 830 inputs a codebook 810 or codebook entries of users that have been assigned improved ECC codewords according to the present invention. The codebook generator may be the codebook generator of FIG. 5b or a pre-stored list of codewords that are the output of a generator similar to FIG. 5b. An extracted watermark codeword 820 of a suspected digital product, such as a pirated multimedia product, is also input into the adaptive detector apparatus 830. In one embodiment, the forensic codeword from a pirated digital content codeword 820 is extracted and is provided to the adaptive detector 830.

Input buffers 832 are used to accept the inputs and render the inputs useable by the processor 834. Processing of the suspected digital content codeword 820 commences under direction of the processor 834 according to aspects of the present invention. In one embodiment, the process 700, which implements the adaptive detector flow, may be made available to the processor as removable or fixed computer-readable media. The media have computer-executable instructions stored thereon in a tangible medium such as magnetic, optical, or solid state memory. In one embodiment, the processor controls a firmware block that performs steps of process 700. Thus process 700 may be stored as software 836 or may be coded in firmware 836 in a device available to the processor 834. Memory 835 may be used by the processor in executing process 700 or may be used to store instructions for process 700. Any configuration of processor, memory, and software and or hardware may be used as is understood by those of skill in the art. Results of the processing computer instruction of process 700 are provided to output buffers 838 to a display 840 for viewing by a user of system 800. The display may be any form of tangible display, such as a computer monitor, printout, or other means to impart results information to a system 800 user.

Test results of the above described adaptive detector were accomplished via computer simulation. In the simulation settings, there are $2^{20}$ users. The number of colluders c is up to 5; the RS code has 32 alphabets, and the code length is 31. Thus the minimal distance is 28. The inner codes are the permuted-modified/improved Hadamard codes as presented above, and the detector is the adaptive detector as described above. In general, the number of embeddable bits in 5-minutes of suspected digital content clip is on the order of $10^8$, and according to the simulation results, the equivalent BER of common processing such as compression is in the range of 0.4 to 0.44. Note that the overall code length is approximately $6 \times 10^6$, which allows repeats of each code bit at least 20 times. At the detector, majority voting on these 20 repeated bits is used to make a decision on the code bit. The binary symmetric channel (BSC) is assumed to flip each bit independently with a probability BER. Then, repeating the code bit 20 times coupled with the majority voting detection could result in an equivalent BER of 0.3 on the code bit (corresponding to 0.44 BER on raw bit). Thus, in the simulation results, the repetition and majority voting processing are omitted for simplicity since the performance of the code with $6 \times 10^6$ bits under BER up to 0.32 is reasonable. Threshold (a) ($TH_a$) for the hard detector is set to 1.5, and threshold (b) $TH_b$ for the adaptive detector is 9. The code length of the inner code is $2 \times 10^5$ to fully utilize all the bits and to permute the Hadamard matrix as many times as possible. The results are based on 200 simulation runs.

Figure 9:
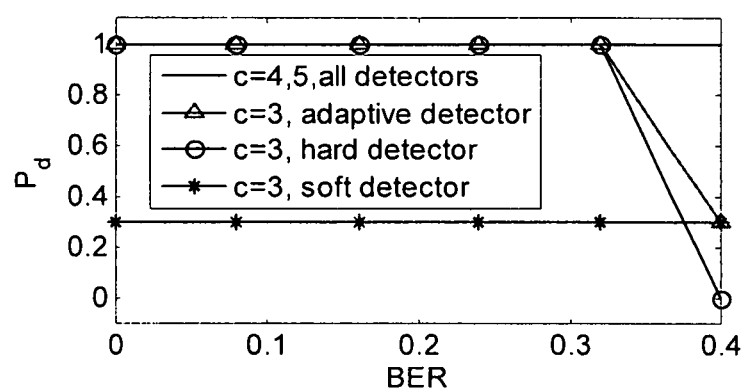
FIG. 9 depicts the probability detection under a minority attack according to aspects of the invention.

FIG. 9 depicts the collusion resistance under minority attack for the adaptive detector, soft detector, and hard detector when the number of colluders c=3, 4, 5 and BER from 0 to 0.4. Here, the BER at 0.4 is examined in order to show the advantage of the adaptive detector over a single hard or soft detector. Note that the adaptive detector of the present invention using the improved ECC completely outperforms the basic ECC when the number of colluders is 3. At c=3, the basic ECC fails completely to detect a colluder. The present improved ECC with the modified inner code is effective to detect 3 or more colluders accurately when the BER is less than 0.32. Referring to FIG. 9, the hard detector in the present invention can catch the colluders perfectly when BER is less than 0.32. However, when BER becomes too large, the hard detector cannot identify the suspicious inner codes for each symbol, therefore the colluder-user identification (traitor-tracing) performance degrades quickly as BER increases. It is clear that the adaptive detector can make accurate detections/decisions between the soft detector and the hard detector. The threshold (a) for hard detector is set to be 1.5, and the threshold (b) for the soft detector is set to be 9 in the simulation. As discussed above, the soft detector fails when 3 colluders conduct a minority attack, but the hard detector of the present invention detects 3 minority colluders well. In other scenarios, the soft detector can work perfectly for BER is less than or equal to 0.4. Thus the performance of the soft detector does not change with BER.

The invention claimed is:

1. A method performed by a computer system, the method comprising:
generating a square matrix whose rows are mutually orthogonal;
permuting rows of the square matrix to generate a plurality of permuted square matrices;
aggregating the plurality of permuted square matrices to produce aggregated rows; and
using the computer system, applying one of the aggregated rows as a codeword in a digital watermark to a digital product, wherein said digital watermark is immune to minority attacks of three colluders.

2. The method of claim 1, further comprising:
displaying, using a computer system, one of the aggregated rows, wherein the displayed aggregated row represents a codeword for a digital watermark.

3. The method of claim 1, further comprising:
substituting the codeword into an outer code of the digital watermark.

4. The method of claim 3, further comprising:
randomly permuting bits of the codeword after the substituting step but before applying the digital watermark to a digital product.

5. The method of claim 3, wherein the outer code is an Error Correcting Code.

6. The method of claim 5, wherein the outer code is a Reed Solomon code.

7. The method of claim 1, wherein the square matrix is a Hadamard matrix.

8. The method of claim 1, wherein the permuting step is accomplished using one of a fixed number of permutations, an exhaustive number of permutations, and a random number of permutations.

9. The method of claim 1, wherein permuting rows of the square matrix comprises randomly permuting the rows of the square matrix.

10. A method for detecting watermarking codewords, using a computing system, the method comprising:
extracting watermark information from a digital product;
inputting said extracted watermark information into an adaptive detector that switches between a hard detector and a soft detector; and,
using the computing system, generating detected watermarking codewords from the output of said adaptive detector, wherein said adaptive detector calculates a vague symbol count based on said input watermark information and switches to said soft detector if said vague symbol count is higher than a pre-determined threshold, and to said hard detector if said vague symbol count is lower than equal to a pre-determined threshold.

11. The method as in claim 10, wherein said digital product is exposed to a collusion attack.

12. The method as in claim 10, wherein said soft detector extracts codewords through correlation from said watermark information.

13. The method as in claim 10, further comprising extracting suspicious symbols from said watermark information for each symbol position of the codeword using said hard detector.

14. The method as in claim 13, further comprising
calculating the number of suspicious symbols for each codeword;
identifying one or more codewords having the largest number of suspicious symbols; and
outputting said identified one or more codewords.

15. The method as in claim 10 further comprising a metric statistic for user i at symbol j, $T_i^{(j)}$, which is a function of the difference between the detection statistic of user i and the median of the detection statistics of all users.

16. An apparatus for watermarking comprising a computer system configured to:
generate a square matrix whose rows are mutually orthogonal;
permute rows of the square matrix to generate a plurality of permuted square matrices;
aggregate the plurality of permuted square matrices to produce aggregated rows; and
apply one of the aggregated rows as a codeword in a digital watermark to a digital product, wherein said digital watermark is immune to minority attacks of three colluders.

17. The apparatus of claim 16, further configured to:
display, one of the aggregated rows, wherein the displayed aggregated row represents a codeword for a digital watermark.

18. The apparatus of claim 16, further configured to:
substitute the codeword into an outer code of the digital watermark.

19. The apparatus of claim 18, wherein the outer code is an Error Correcting Code.

20. The apparatus of claim 19, wherein the outer code is a Reed Solomon code.

21. The apparatus of claim 18, further configured to:
randomly permute bits of the codeword after the substituting step but before applying the digital watermark to a digital product.

22. The apparatus of claim 16, wherein the square matrix is a Hadamard matrix.

23. The apparatus of claim 16, wherein it is configured to permute by using one of a fixed number of permutations, an exhaustive number of permutations, and a random number of permutations.

24. The apparatus of claim 16, wherein permuting rows of the square matrix comprises randomly permuting the rows of the square matrix.

25. An apparatus for detecting watermarking codewords comprising a computing system configured to:
receive watermark information from a digital product;
input said extracted watermark information into an adaptive detector that switches between a hard detector and a soft detector; and,
generate detected watermarking codewords from the output of said adaptive detector, wherein said adaptive detector calculates a vague symbol count based on said input watermark information and switches to said soft detector if said vague symbol count is higher than a pre-determined threshold, and to said hard detector if said vague symbol count is lower than equal to a pre-determined threshold.

26. The apparatus of claim 25, wherein said digital product is exposed to a collusion attack.

27. The apparatus of claim 25, wherein said soft detector extracts codewords through correlation from said watermark information.

28. The apparatus of claim 25, further configured to:
extract suspicious symbols from said watermark information for each symbol position of the codeword using said hard detector.

29. The apparatus of claim 28, further configured to:
calculate the number of suspicious symbols for each codeword;
identify one or more codewords having the largest number of suspicious symbols; and
output said identified one or more codewords.

30. The apparatus of claim 25 further configured to:
applying a metric statistic for user i at symbol j, $T_i^{(j)}$, which is a function of the difference between the detection statistic of user i and the median of the detection statistics of all users.

* * * * *